United States Patent
Douglas, III et al.

(10) Patent No.: US 6,366,129 B1
(45) Date of Patent: Apr. 2, 2002

(54) METHOD AND APPARATUS FOR BUFFERING AN INPUT-OUTPUT NODE OF AN INTEGRATED CIRCUIT

(75) Inventors: Kenneth R. Douglas, III, Sunnyvale; Harry Muljono, Union City; Stefan Rusu, Sunnyvale, all of CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/189,341

(22) Filed: Nov. 10, 1998

(51) Int. Cl.[7] .............................. H03K 3/00; H03K 17/16
(52) U.S. Cl. .............................. 326/86; 326/30; 326/90; 327/112; 327/391; 327/108
(58) Field of Search .................. 326/83, 86, 87, 326/21, 22, 26, 27; 327/112, 391, 108

(56) References Cited

U.S. PATENT DOCUMENTS

| | | | | |
|---|---|---|---|---|
| 5,436,578 A | * | 7/1995 | Brown et al. | 326/87 |
| 5,602,494 A | * | 2/1997 | Sundstrom | 326/39 |
| 5,923,183 A | * | 7/1999 | Kim et al. | 326/27 |
| 5,949,254 A | * | 9/1999 | Keeth | 326/87 |
| 5,966,036 A | * | 10/1999 | Hoff et al. | 327/112 |
| 6,026,456 A | * | 2/2000 | Ilkbahar | 710/101 |
| 6,084,426 A | * | 7/2000 | Allen | 326/31 |
| 6,114,885 A | * | 9/2000 | Yang et al. | 327/112 |
| 6,114,895 A | * | 9/2000 | Stephens | 327/391 |
| 6,118,310 A | * | 9/2000 | Esch, Jr. | 327/108 |
| 6,124,747 A | * | 9/2000 | Nasu | 327/281 |

\* cited by examiner

*Primary Examiner*—Michael Tokar
*Assistant Examiner*—Vibol Tan
(74) *Attorney, Agent, or Firm*—David J. Kaplan

(57) ABSTRACT

An input-output (I-O) buffer for an integrated circuit. The buffer includes a controller and first and second groups of transistors to pull the node up and down, respectively. The controller is configured to turn on a transistor from the first group to drive a high bit on the node during a first period of time. The controller is further configured to turn on transistors from both the first and second groups, simultaneously, to terminate the node during a second period of time.

29 Claims, 4 Drawing Sheets

METHOD AND APPARATUS FOR BUFFERING AN INPUT-OUTPUT NODE OF AN INTEGRATED CIRCUIT

The present invention relates to computer systems and more particularly to an input-output buffer for driving signals on a node of an integrated circuit.

BACKGROUND

Computer systems, from small handheld electronic devices to medium-sized mobile and desktop systems to large servers and workstations, are becoming increasingly pervasive in our society. A typical computer system includes two or more integrated circuits (ICs) affixed to a printed circuit board (PCB). The ICs communicate with one another by sending signals across transmission lines formed on the PCB. For example, one IC may be a processor while one or more other ICs are memory devices that the processor accesses to store and retrieve data. Increasing the speed, or frequency, at which signals are sent across these transmission lines tends to increase the computational power of the computer. Unfortunately, there are electrical properties that limit the signal frequency.

Inductance, resistance, and capacitance on the transmission lines not only limit the frequency but also introduce noise into the signals. Noise may be compensated for by allowing more time for each bit of the signal to settle on the transmission line before the next bit is sent, thereby further reducing signal frequency.

In an effort to overcome some of these limitations, most ICs include input-output (I-O) buffers. An I-O buffer conditions a signal driven to and received from another IC. A typical I-O buffer conditions an output signal generated by the IC by boosting the signal's voltage or current levels before driving the signal on the transmission line. This boosted signal may then be transferred to another IC via the transmission line more cleanly. The I-O buffer may condition an input signal received from another IC via the transmission line by adjusting the signal's voltage or current levels before providing the signal to other circuitry within the IC. The I-O buffer may additionally provide electrostatic discharge protection for the IC.

SUMMARY OF THE INVENTION

An I-O buffer for an integrated circuit and a method for operating the buffer are described. In accordance with one embodiment of the present invention, a buffer for an I-O node includes a controller and first and second groups of transistors to pull the node up and down, respectively. The controller is configured to turn on a transistor from the first group to drive a high bit on the node during a first period of time. The controller is further configured to turn on transistors from both the first and second groups, simultaneously, to terminate the node during a second period of time.

In accordance with another embodiment of the present invention, the controller is configured to turn on a transistor from the second group to drive a low bit on the node during a third period of time.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

An input-output (I-O) buffer for an integrated circuit and a method for operating the buffer are described. In accordance with one embodiment of the present invention, one I-O buffer of a first integrated circuit (IC) is coupled to similarly designed I-O buffers of one or more other ICs via a transmission line. Each buffer includes four groups of transistors and a controller. The first group includes p-channel driving transistors configured to drive a high bit on the line by pulling the line up. The second group includes n-channel driving transistors configured to drive a low bit on the line by pulling the line down. The third and fourth groups include p-channel and n-channel terminating transistors, respectively, configured to terminate the line by pulling the line up and down simultaneously. The gates of each of the transistors are coupled to a controller.

For the buffer of the first IC to drive a high bit on the transmission line, the controller in the first IC turns on selected p-channel driving transistors and turns off its other groups of transistors. The p-channel driving transistors that are turned on are selected by the controller to provide a desired output impedance. While the high bit is being driven by the first IC, a controller in one or more of the other ICs coupled to the transmission line turns on selected p-channel and n-channel terminating transistors. The terminating transistors that are turned on are selected by the controller to provide a desired input impedance.

For the buffer of the first IC to drive a low bit on the line, the controller in the first IC turns on selected n-channel driving transistors and turns off its other groups of transistors. The n-channel driving transistors that are turned on are selected by the controller to provide a desired output impedance. While the low bit is being driven by the first IC, the controller in one or more of the other ICs coupled to the transmission line turns on selected p-channel and n-channel terminating transistors to provide a desired input impedance.

The input and output impedances provided by I-O buffers designed in accordance with an embodiment of the present invention are determined by an impedance compensation unit. The impedances are calculated to dampen signal noise, including, for example, signal overshoot and bounce-back, thereby providing a cleaner signal. This cleaner signal may then be communicated between ICs at higher frequencies. A more detailed description of embodiments of the present invention, including various configurations and implementations, is provided below.

Figure 1A:
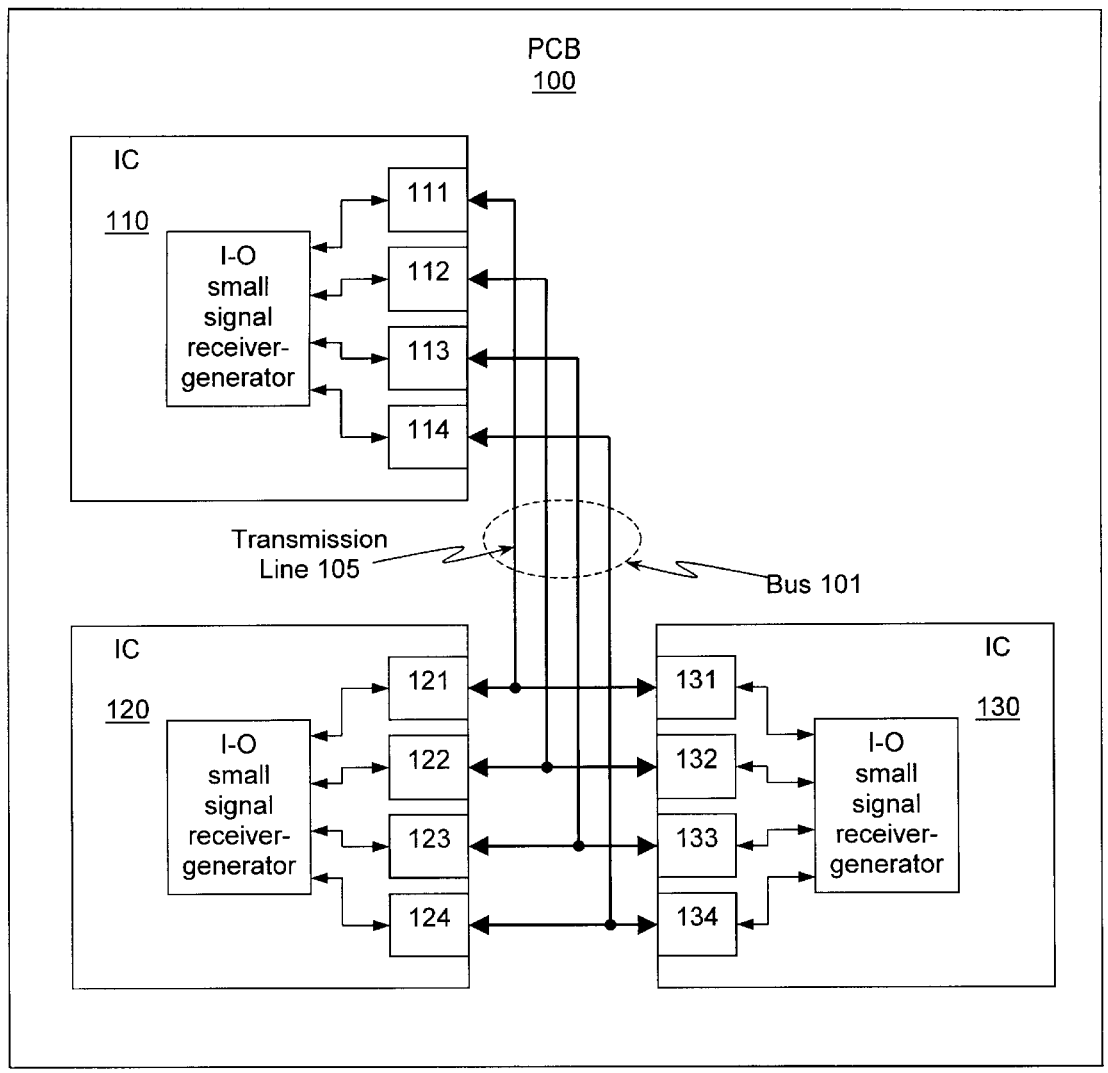
FIG. 1A is a computer system formed in accordance with an embodiment of the present invention.

FIG. 1A is a computer system formed in accordance with an embodiment of the present invention in which IC 110, including I-O buffers 111–114, IC 120, including I-O buffers 121–124, and IC 130, including I-O buffers 131–134, are coupled together via bus 101 comprising transmission lines formed on printed circuit board 100. In particular, I-O buffer 111 of IC 110 is coupled to I-O buffers 121 and 131 by transmission line 105 of bus 101. Each of the ICs includes an internal structure in which I-O small signals are received from the I-O buffers, or generated for output to the I-O buffers. These small signals may be stored and manipulated within the IC.

In accordance with one embodiment of the present invention, an IC arbitrates for and wins ownership of a bus.

Once ownership is granted to the IC, the I-O buffer of the IC drives a signal on the transmission lines of the bus to the other ICs while the I-O buffers of the other ICs terminate the line. For example, for one embodiment of the present invention, IC 110 of FIG. 1A is a processor, and ICs 120 and 130 are memory devices that constitute the cache memory for the processor. When the processor sends data to IC 130 for storage, the I-O buffers of IC 110 drive the data onto the transmission lines of bus 101 while the I-O buffers of ICs 120 and 130 terminate the lines. When IC 120 sends data to the processor, the I-O buffers of IC 120 drive the data onto the transmission lines of the bus while the I-O buffers of ICs 110 and 130 terminate the lines. For one embodiment of the present invention, each IC coupled to a transmission line of the bus either drives a signal on the line or, when not driving a signal, terminates the line.

Figure 1B:
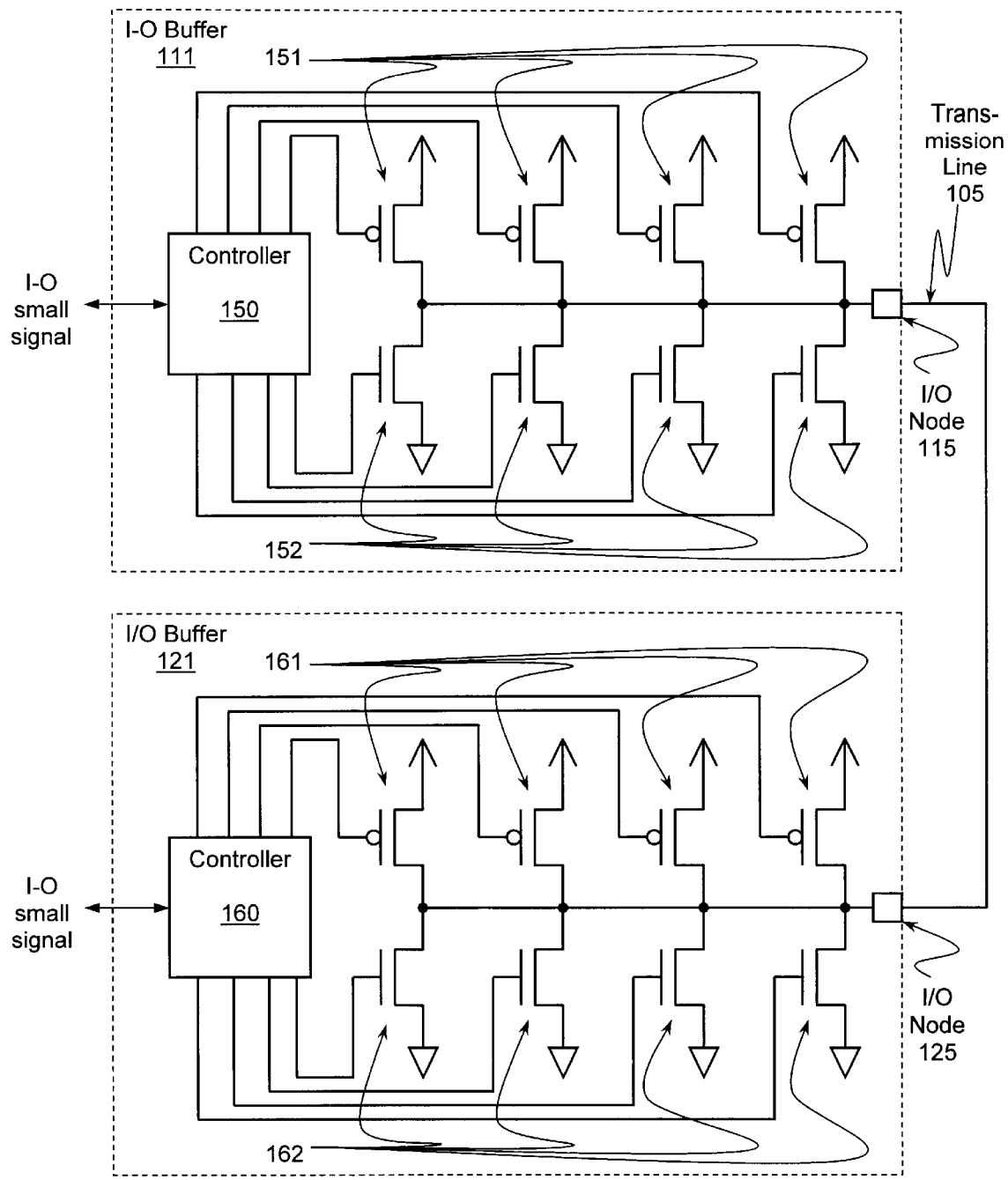
FIG. 1B shows I-O buffers of FIG. 1A.

FIG. 1B shows I-O buffers 111 and 121 of FIG. 1A. I-O buffer 111 is the buffer for I-O node 115, and I-O buffer 121 is the buffer for I-O node 125. The buffers are coupled to each other via transmission line 105, which is coupled to the nodes. Buffer 111 includes controller 150 coupled to an I-O small signal line. Controller 150 is coupled to the gates of p-channel pull-up transistors 151 and the gates of n-channel pull-down transistors 152. The drains of transistors 151 and 152 are coupled to node 115. Buffer 121 includes controller 160 coupled to an I-O small signal line. Controller 160 is coupled to the gates of p-channel pull-up transistors 161 and the gates of n-channel pull-down transistors 162. The drains of transistors 161 and 162 are coupled to node 125.

Figure 2:
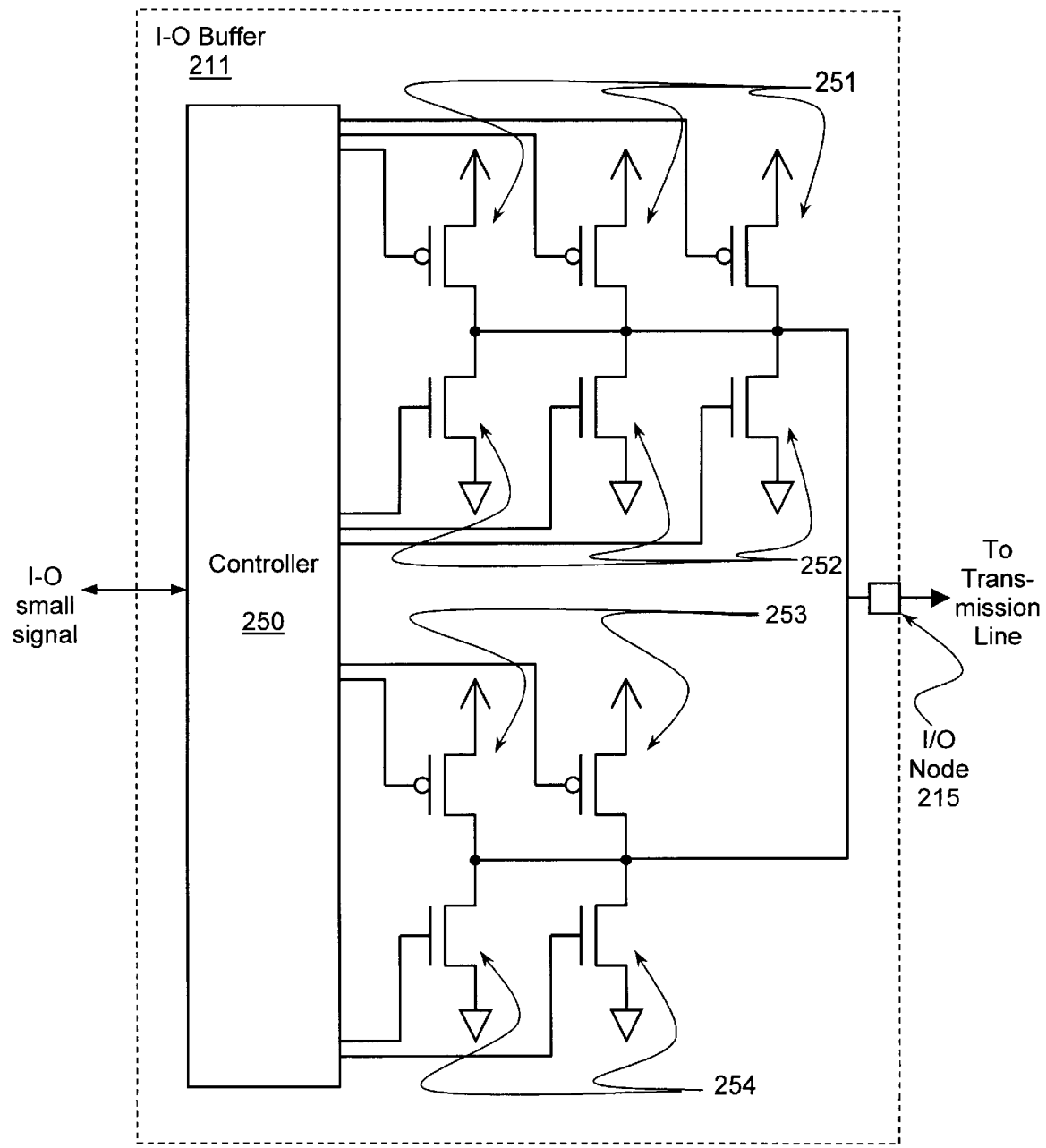
FIG. 2 is an I-O buffer in accordance with another embodiment of the present invention.

For one embodiment, nodes are the I-O ports to the IC and may include contact pads, controlled collapsible chip connect (C4) bumps, bonded wires, solder balls, or pins. In accordance with an alternate embodiment of the present invention, an alternate number of similarly coupled pull-up and pull-down transistors are included in the buffer. For some embodiments, the number of pull-up transistors is different from the number of pull-down transistors. For one embodiment, the transistors are of varying widths. The widths and numbers of transistors may be selected to strike a desired balance between the size of the buffer, the driving current of the buffer, the input and output impedance of the buffer, and the susceptibility of the buffer to electrostatic discharge (ESD) damage. Note that certain elements of the buffers of FIGS. 1B and 2 are not shown to avoid obscuring the present invention. For example, for one embodiment, an I-O buffer additionally includes input transistors (the gates of which are coupled to the transmission line) and ESD protection devices.

Initially, consider the operation of the I-O buffers of FIG. 1B when buffer 111 drives a signal on node 115 and buffer 121 terminates node 125. The signal is provided to controller 150 via an I-O small signal line within the IC. Assuming that the first bit of the signal is a high bit, controller 150 turns on a selection of p-channel pull-up transistors 151 and turns off all n-channel pull-down transistors 152. The selection of transistors 151 that is turned on is determined within controller 150 to provide the desired driving current and output impedance for buffer 111 in light of manufacturing variation and the configuration of the system in which IC 110 operates. This selection may be determined within controller 150 by a hard-wired user setting (e.g. designed into the IC), a ROM setting (e.g. blown fuses or EPROM), a software user setting (e.g. a BIOS command or setup application program), or by an impedance compensation unit that calculates a desired setting based on a voltage or current measurement and sends an appropriate signal to controller 150. For one embodiment of the present invention, transistors 151 are of varying widths so that a proper selection of transistors can provide an output impedance that is close to the desired output impedance.

When the appropriate selection of transistors 151 of FIG. 1B are turned on, the transistors pull node 115 nearly up to the supply voltage level (e.g. Vcc), to drive the high bit on the node. This, in turn, pulls up transmission line 105, driving the high bit on the line. The high bit is driven to all other ICs having I-O buffers coupled to line 105, including IC 120 having buffer 121. Note that the signal being driven may or may not be intended for IC 120. For one embodiment of the present invention, if the signal is not intended for IC 120, the signal is primarily ignored by IC 120 except for, at least, the signaling and driving of the last bit (as described below).

Controller 160 of FIG. 1B turns on a selection of p-channel pull-up transistors 161 as well as a selection of n-channel pull-down transistors 162 to pull transmission line 105 up and down simultaneously. The selection of transistors 161 and 162 that is turned on is determined within controller 160 to provide the desired input impedance. This selection may be determined within controller 160 in a manner similar to that described above for controller 150. The selection of transistors 161 that is turned on may be the same or different from the selection of transistors 162. For one embodiment of the present invention, transistors 161 and 162 are of varying widths so that a proper selection of transistors can provide an input impedance that is close to the desired input impedance. The desired input impedance is that which adequately dampens signal noise while still providing for adequate signal swing, allowing for higher frequency signal transmission.

Transistor pull strength is determined by the number and widths of transistors pulling on a node. Buffer 121 of FIG. 1B terminates line 105 by pulling the line up and down simultaneously with approximately equal strength such that if transistors 151 were turned off, buffer 121 would drive line 105 to approximately Vcc/2. The selection of transistors 151 that are turned on to drive the high bit on transmission line 105 of FIG. 1B provide a relatively strong pull while the selection of transistors 161 and 162 that are turned on to terminate the line provide a relatively weak pull. Because transistor pull strength is inversely proportional to impedance, it may alternatively be stated that the output impedance of buffer 111 is lower than the input impedance of buffer 121. The proper match between output and input impedances to provide for high signal frequency depends on the number of ICs coupled to the transmission line, system configuration, voltage and current levels, and other electrical characteristics. Note that Transmission line 105 may be additionally terminated by other I-O buffers coupled to the transmission line, such as buffer 131 of IC 130. For an alternate embodiment, other ICs may be coupled to the transmission line with or without providing termination.

For one embodiment of the present invention, the output to input impedance ratio of I-O buffers on a transmission line to which two ICs are coupled is between approximately 1:1.5 and 1:2.5. For an embodiment in which three ICs are coupled to the transmission line, the output to input impedance ratio is between approximately 1:2 and 1:6. For an embodiment in which five ICs are coupled to the transmission line, the output to input impedance ratio is between approximately 1:6 and 1:10.

Now consider the operation of the I-O buffers of FIG. 1B when buffer 111 drives a low bit on node 115 and buffer 121 terminates node 125. Controller 150 turns on a selection of n-channel pull-down transistors 152 and turns off all of p-channel pull-up transistors 151. The selection of transistors 152 that is turned on is determined within controller 150 to provide the desired driving current and output impedance for buffer 111 and may be determined as described above. For one embodiment of the present invention, transistors 152 are of varying widths so that a proper selection of transistors can provide an output impedance that is close to the desired output impedance. Note that the selection of transistors 152 that is turned on to drive a low bit may be the same or different relative selection as the selection of transistors 151 that is turned on to drive a high bit.

When the appropriate selection of transistors 152 of FIG. 1B are turned on, the transistors pull transmission line 105 nearly down to ground (or Vss), to drive the low bit on the line. The low bit is driven to all other ICs having I-O buffers coupled to line 105, including IC 120. Controller 160 continues to turn on the selection of p-channel pull-up transistors 161 as well as the selection of n-channel pull-down transistors 162 to pull transmission line 105 up and down simultaneously, terminating the line. As with driving the high bit described above, the selection of transistors 152 that are turned on to drive the low bit on transmission line 105 provide a relatively strong pull while the selection of transistors 161 and 162 that are turned on to terminate the line provide a relatively weak pull.

As stated above, buffer 121 of FIG. 1B terminates line 105 by pulling the line up and down simultaneously with approximately equal strength such that if transistors 151 were turned off, buffer 121 would drive line 105 to approximately Vcc/2. Vcc/2 is an indeterminate state, so it may be undesirable to allow this voltage to be applied to the I-O buffers of the ICs coupled to the transmission line. Therefore, in accordance with one embodiment of the present invention, the transmission line that couples the ICs together is always driven either high or low by at least one I-O buffer. In this manner, the tendency of the terminating transistors to drive the transmission line to Vcc/2 is overcome by the driving transistors that drive the transmission line to Vcc or Vss.

For example, consider the operation of the I-O buffers when IC 110 of FIG. 1A nearly completes driving its signal to ICs 120 and 130, and IC 120 is the next IC to gain ownership of bus 101. For one embodiment of the present invention, a handshake between ICs 110 and 120 keeps the transmission lines of bus 101 from being driven to Vcc/2 by the terminating transistors. In this handshake protocol, IC 120 determines when IC110 is driving the last bit of its signal. IC 120 may make this determination by reading information in the signal off the bus or by receiving a separate side-band signal from IC 110. While IC 110 is driving the last bit of its signal, IC 120 simultaneously drives the same bit. The I-O buffers of IC 110 then switch to termination mode and the buffers of IC 120 continue to drive bus 101 with a new signal. For an alternate embodiment of the present invention, an additional handshake bit or plurality of bits may be inserted between signals sent by the ICs for purposes of implementing this handshake protocol. Note, however, that as used herein, any such additional handshake bit or plurality of bits is defined to be part of the signal that precedes it.

Consider the operation of the I-O buffers of FIG. 1B when buffer 111 of IC 110 switches to termination mode, terminating transmission line 105 of bus 101, after buffer 121 of IC 120 switches to drive mode, driving a new signal on line 105. Controller 150 turns on a selection of p-channel pull-up transistors 151 as well as a selection of n-channel pull-down transistors 152 to pull transmission line 105 up and down simultaneously. The selection of p-channel and n-channel transistors turned on by controller 150 is now different from when buffer 111 drove the signal on transmission line 105. In addition to turning on both p-channel and n-channel transistors simultaneously, the selection of transistors provides for a weaker pull when buffer 111 is terminating the transmission line than when buffer 111 is driving the transmission line. For one embodiment of the present invention, I-O buffer 111 operates in a manner similar to that described above for I-O buffer 121 in termination mode.

Controller 160 of FIG. 1B turns on either a selection of p-channel pull-up transistors 161 or a selection of n-channel pull-down transistors 162 to pull transmission line 105 up or down depending on the signal bit being driven by buffer 121. The selection of p-channel and n-channel transistors turned on by controller 160 is now different from when buffer 121 terminated transmission line 105. In addition to turning on either the p-channel or the n-channel transistors independently, the selection of transistors provides for a stronger pull when buffer 121 is driving the transmission line than when buffer 121 is terminating the transmission line. For one embodiment of the present invention, I-O buffer 121 operates in a manner similar to that described above for I-O buffer 111 in signal driving mode.

In accordance with an alternate embodiment of the present invention, one or more pull-down transistors of a buffer driving a high bit remain on, and one or more pull-up transistors of a buffer driving a low bit remain on while the bit is being driven. For example, a selection of one or more pull-down transistors 152 of FIG. 1B may be on while the selection of pull-up transistors 151 are also on, pulling transmission line 105 up to drive a high bit on the line. For this embodiment, the pull-up transistors pull stronger than the pull-down transistors, so line 105 is ultimately pulled up to nearly Vcc. As another example, a selection of one or more pull-up transistors 151 of FIG. 1B may be on while the selection of pull-down transistors 152 are also on, pulling transmission line 105 down to drive a low bit on the line. For this embodiment, the pull-down transistors pull stronger than the pull-up transistors, so line 105 is ultimately pulled down to nearly Vss. Although an I-O buffer may consume more power to drive a signal in this manner, this embodiment may be found useful to help simplify the controller logic or to adjust the impedance to provide a cleaner signal.

FIG. 2 is an I-O buffer in accordance with another embodiment of the present invention. Buffer 211 includes controller 250 coupled to an I-O small signal line. Controller 250 is coupled to the gates of a first group of p-channel pull-up transistors 251, a second group of p-channel pull-up transistors 253, a first group of n-channel pull-down transistors 252, and a second group of n-channel pull-down transistors 254. The drains of the transistors are coupled to node 215.

Buffer 211 of FIG. 2 operates in a manner similar to buffers 111 and 121 of FIG. 1B. Note, however, that the transistors in the buffers of FIG. 1B operate alternatively as either driving or terminating transistors. That is, the selection of transistors that are turned on to pull a node up or down to drive a signal on a transmission line may overlap the selection of transistors that are turned on to terminate the transmission line. For example, one or more of transistors 151 may operate exclusively as driving transistors and are only turned on by controller 150 to pull up transmission line 115 when buffer 111 drives a high bit on the line. Another one or more of transistors 151 may operate exclusively as terminating transistors and are only turned on, along with a selection of pull-down transistors 152, to terminate the line when buffer 111 is in termination mode. A separate group comprising one or more of transistors 151 may operate alternatively as driving transistors when buffer 111 drives a high bit on line 115, and as terminating transistors when buffer 111 terminates the line.

In contrast, all of the transistors of buffer 211 of FIG. 2 are dedicated to either driving a signal on node 215 or terminating node 215, exclusively. That is, the selection of transistors that are turned on to pull the node up or down to drive a signal on the node does not overlap the selection of transistors that are turned on to terminate the node. Transistors 251 and 252 are dedicated driving transistors, and transistors 253 and 254 are dedicated terminating transistors.

When buffer 211 of FIG. 2 drives a high bit on node 215, controller 250 turns on a selection of p-channel pull-up transistors 251 and turns off all other transistors. When buffer 211 drives a low bit on node 215, controller 250 turns on a selection of n-channel pull-down transistors 252 and turns off all other transistors. The selection of transistors 251 and 252 that is turned on is determined within controller 250 as discussed above. For one embodiment of the present invention, transistors 251 and 252 are of varying widths so that a proper selection of transistors can provide an output impedance that is close to the desired output impedance.

When buffer 211 of FIG. 2 is not driving a signal on node 215, the buffer is in termination mode. To terminate node 215, controller 250 turns on a selection of both p-channel pull-up transistors 253 and n-channel pull-down transistors 254.

Transistors 251 and 252 are turned off. The selection of transistors 253 and 254 that is turned on is determined within controller 250 as discussed above. For one embodiment of the present invention, transistors 253 and 254 are of varying widths so that a proper selection of transistors can provide an output impedance that is close to the desired output impedance.

The embodiment of the present invention shown in FIG. 2 may be found advantageous over the embodiment of FIG. 1B because the logic of controller 250 may be made simpler, resulting in a smaller controller size. In accordance with an alternate embodiment of the present invention, the logic of controller 250 may be further simplified by placing a proper selection of transistors 253 and 254 in an always-on state.

Figure 3:
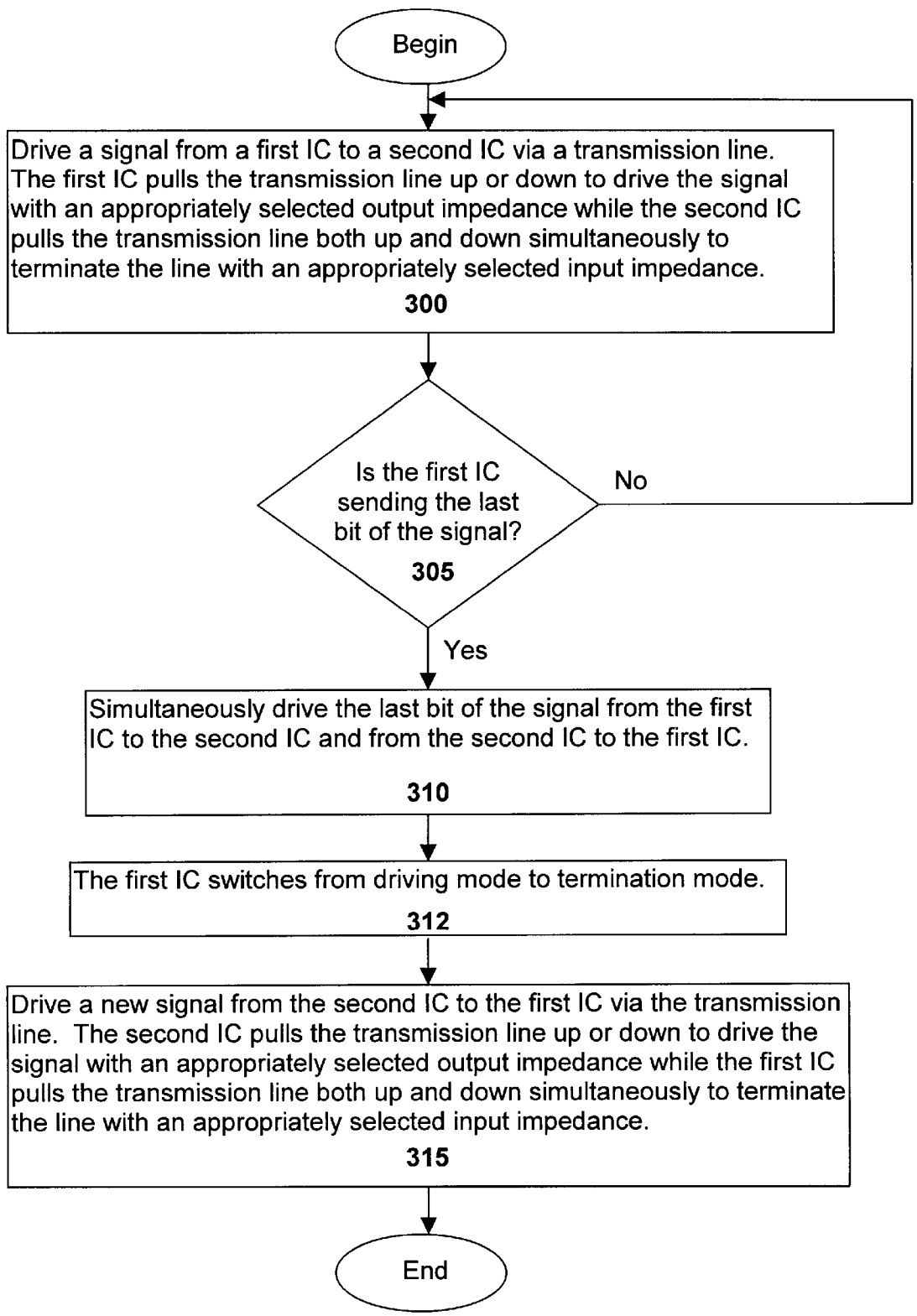
FIG. 3 is a flow chart of a method of the present invention.

FIG. 3 is a flow chart of a method of the present invention. At step 300, a signal is driven from a first IC to a second IC via a transmission line using I-O buffers designed in accordance with an embodiment of the present invention. The first IC pulls the transmission line either up or down to drive the signal bits high or low, respectively, with an appropriately selected output impedance. The output impedance is determined by turning on an appropriate combination of driving transistors from a set of available transistors in the I-O buffer. The second IC, meanwhile, pulls the transmission line both up and down simultaneously to terminate the line with an appropriately selected input impedance. The input impedance is determined by turning on an appropriate combination of terminating transistors from the set of available transistors in the I-O buffer.

At step 305 of FIG. 3, it is determined if the first IC is sending the last bit of the signal. If the last bit of the signal is not being sent, the first IC continues to drive the signal on the transmission line while the second IC terminates the line at step 300. If, however, the last bit of the signal is being driven on the transmission line by the first IC, and the second IC is next to drive a new signal on the line, then the process flow proceeds to step 310.

At step 310, while the first IC is still driving the last bit of the signal on the transmission line, the second IC switches from termination to driving mode and simultaneously drives the last bit on the line along with the first IC. Once the second IC begins driving, then, at step 312, the first IC switches from driving to termination mode.

Next, at step 315 of FIG. 3, a signal is driven from the second IC to the first IC via the transmission line. The second IC pulls the transmission line either up or down to drive the signal bits high or low, respectively, with an appropriately selected output impedance. The first IC, meanwhile, pulls the transmission line both up and down simultaneously to terminate the line with an appropriately selected input impedance.

This invention has been described with reference to specific exemplary embodiments thereof. It will, however, be evident to persons having the benefit of this disclosure that various modifications and changes may be made to these embodiments without departing from the broader spirit and scope of the invention. The specification and drawings are, accordingly, to be regarded in an illustrative rather than a restrictive sense.

What is claimed is:

1. An input-output (I-O) buffer for an I-O node comprising:
    a first plurality of transistors to pull the node up;
    a second plurality of transistors to pull the node down; and
    a controller to turn on a transistor of the first plurality to drive a high bit on the node during a first period of time, and to turn on both the transistor of the first plurality- and a transistor of the second plurality, simultaneously, to terminate the node during a second period of time.

2. The buffer of claim 1, wherein the controller is to turn on the transistor of the second plurality to drive a low bit on the node during a third period of time.

3. The buffer of claim 2, wherein the controller is to turn on a first sub-plurality of the first plurality to drive a high bit on the node during the first period of time, to turn on a first sub-plurality of the second plurality to drive a low bit on the node during the third period of time, and to turn on both a second sub-plurality of the first plurality and a second sub-plurality of the second plurality to terminate the node during the second period of time.

4. The buffer of claim 1, wherein the controller is to turn on a first sub-plurality of the first plurality to drive a high bit on the node during the first period of time, and to turn on both a first sub-plurality of the first plurality and a sub-plurality of the second plurality to terminate the node during the second period of time.

5. The buffer of claim 1, wherein the first plurality comprises p-channel transistors and the second plurality comprises n-channel transistors.

6. An integrated circuit comprising:
    a node;
    first and second transistors to pull the node up and down, respectively;
    third and fourth transistors to pull the node up and down, respectively; and
    a controller to turn on the second transistor and to turn off the first transistor to drive a low bit on the node during a first period of time;
    and to turn on both the third and fourth transistors and to turn off both the first and second transistors to terminate the node during a second period of time.

7. The integrated circuit of claim 6, wherein the node is an input-output contact pad.

8. The integrated circuit of claim 6, wherein the controller is to turn off the second transistor and to turn on the first transistor to drive a high bit on the node during a third period of time.

9. The integrated circuit of claim 8, wherein the controller is to turn off both the third and fourth transistors during both the first and third periods of time.

10. The integrated circuit of claim 6, wherein the controller is to turn off both the third and fourth transistors during the first period of time.

11. The integrated circuit of claim 6, wherein the controller is to turn on both the third and fourth transistors during the first period of time.

12. The integrated circuit of claim 6, wherein the integrated circuit is a processor.

13. A computer system comprising:
   a circuit board having a first integrated circuit (IC) coupled to a second IC via a transmission line disposed thereon; and
   a first buffer disposed on the first IC comprising a first plurality of pull-up transistors to drive a high bit on the line, a first plurality of pull-down transistors to drive a low bit on the line, and a first plurality of pull-up and pull-down transistors to terminate the line by pulling the line up and down simultaneously.

14. The system of claim 13, further comprising a third IC coupled to the first and second ICs via the transmission line.

15. The system of claim 13, further comprising a second buffer disposed on the second IC comprising a second plurality of pull-up transistors to drive a high bit on the line, a second plurality of pull-down transistors to drive a low bit on the line, and a second plurality of pull-up and pull-down transistors to terminate the line by pulling the line up and down simultaneously.

16. The system of claim 13, wherein the first plurality of pull-up and pull-down transistors includes transistors from both the first plurality of pull-up transistors and the first plurality of pull-down transistors.

17. The system of claim 13, wherein the first IC is a processor and the second IC is a cache memory for the processor.

18. A method of buffering a node comprising:
   driving a high bit on the node by turning on a first plurality of pull-up transistors and turning off a first plurality of pull-down transistors to pull up the node; and
   terminating the node by turning on a second plurality of both pull-up and pull down transistors to pull the node up and down simultaneously.

19. The method of claim 18, further comprising driving a low bit on the node by turning off the first plurality of pull-up transistors and turning on the first plurality of pull-down transistors to pull down the node.

20. The method of claim 18, further comprising determining the first plurality of pull-up and pull-down transistors to be a combination of transistors that provides a desired output impedance.

21. The method of claim 18, further comprising determining the second plurality of pull-up and pull-down transistors to be a combination of transistors that provides a desired input impedance.

22. The method of claim 18, wherein driving the high bit includes driving the high bit from a first integrated circuit to a second integrated circuit via a transmission line disposed on a circuit board.

23. The method of claim 18, wherein driving the high bit includes driving the high bit from a processor to a cache memory via a transmission line disposed on a circuit board.

24. The method of claim 18, wherein the second plurality of transistors includes transistors from the first plurality.

25. A method of communicating a signal comprising:
   driving a first signal from a first integrated circuit (IC);
   simultaneously driving a last bit of the first signal from the first IC to the second IC and from the second IC to the first IC;
   switching the first IC from driving to termination mode; and
   driving a second signal from the second IC to the first IC.

26. The method of claim 25, further comprising:
   simultaneously driving a last bit of the second signal from the second IC to the first IC and from the first IC to the second IC; and
   driving a third signal from the first IC to the second IC.

27. The method of claim 25, wherein driving the first signal includes the first IC pulling a transmission line either up or down and the second IC pulling the transmission line both up and down simultaneously.

28. The method of claim 27, wherein driving the second signal includes the second IC pulling the transmission line either up or down and the first IC pulling the transmission line both up and down simultaneously.

29. The method of claim 28, wherein simultaneously driving the last bit of the first signal includes the first and second ICs pulling the transmission line either up or down.

* * * * *